United States Patent
Smatlak et al.

(10) Patent No.: US 7,655,922 B2
(45) Date of Patent: Feb. 2, 2010

(54) TECHNIQUES FOR CONFINING ELECTRONS IN AN ION IMPLANTER

(75) Inventors: Donna L. Smatlak, Belmont, MA (US); Gordon C. Angel, Salem, MA (US); Rajesh Dorai, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 273 days.

(21) Appl. No.: 11/568,000

(22) Filed: Dec. 7, 2006

(65) Prior Publication Data

US 2008/0135775 A1   Jun. 12, 2008

(51) Int. Cl.
*H01J 37/317* (2006.01)

(52) U.S. Cl. .................. 250/396 ML; 250/492.21

(58) Field of Classification Search ............ 250/492.21, 250/396 R, 396 ML, 251
See application file for complete search history.

(56) References Cited

U.S. PATENT DOCUMENTS

| | | | |
|---|---|---|---|
| 4,731,598 A | 3/1988 | Clarke | |
| 5,206,516 A | 4/1993 | Keller et al. | |
| 5,399,871 A | 3/1995 | Ito et al. | |
| 5,703,375 A | 12/1997 | Chen et al. | |
| 6,452,197 B1 * | 9/2002 | Ito | 250/492.21 |
| 6,703,628 B2 | 3/2004 | Ye et al. | |
| 6,759,665 B2 | 7/2004 | Benveniste et al. | |
| 6,794,661 B2 | 9/2004 | Tsukihara et al. | |
| 6,797,968 B2 | 9/2004 | Tsukihara et al. | |
| 6,891,174 B2 | 5/2005 | Wenzel et al. | |
| 2002/0179854 A1 | 12/2002 | Tsukihara et al. | |

FOREIGN PATENT DOCUMENTS

JP      10270197      10/1998

OTHER PUBLICATIONS

K. W. Ehlers, et al., "Low Energy Ion Beam Transport by permanent Magnets", Rev. Sci. Instrum., vol. 51, No. 4, p. 500-503, Apr. 1980.
R. Tuckfield, Jr., et al., "Plasma Guiding by Means of Multipole Fields", Plasma Physics (Journal of Nuclear Energy Part C), vol. 8, p. 271-281, 1966.
G. J. J. Botha, et al., "Converging and Diverging Convection Around Axisymmetric Magnetic Flux Tubes", Mon. Not. R. Astron. Soc., vol. 369, p. 1611-1624, 2006.

* cited by examiner

*Primary Examiner*—Kiet T Nguyen

(57) ABSTRACT

Techniques for confining electrons in an ion implanter are disclosed. In one particular exemplary embodiment, the techniques may be realized as an apparatus for confining electrons in an ion implanter. The apparatus may comprise a first array of magnets and a second array of magnets positioned along at least a portion of a beam path, the first array being on a first side of the beam path and the second array being on a second side of the beam path, the first side opposing the second side. At least one magnet in the first array may have a pole facing an opposite pole of a corresponding magnet in the second array.

19 Claims, 7 Drawing Sheets

TECHNIQUES FOR CONFINING ELECTRONS IN AN ION IMPLANTER

FIELD OF THE DISCLOSURE

The present disclosure relates generally to ion implantation and, more particularly, to techniques for confining electrons in an ion implanter.

BACKGROUND OF THE DISCLOSURE

Ion implanters are widely used in semiconductor manufacturing to selectively alter the conductivity of materials. In a typical ion implanter, ions generated from an ion source are transported downstream through a series of beamline components which may include one or more analyzer and/or corrector magnets and a plurality of electrodes. The analyzer magnets may be used to select desired ion species and filter out contaminant species or ions having undesirable energies. The corrector magnets may be used to manipulate the shape of the ion beam or otherwise adjust the ion beam quality before it reaches a target wafer. Suitably shaped electrodes can be used to modify the energy and the shape of the ion beam. After the ion beam has been transported through the series of beamline components, it may be directed into an end station to perform ion implantation.

FIG. 1 depicts a conventional ion implanter system 100. As is typical for most ion implanters, the system 100 is housed in a high-vacuum environment. The ion implanter system 100 may comprise an ion source 102 and a series of beamline components through which an ion beam 10 passes. The series of beamline components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 118.

As the semiconductor industry keeps reducing feature sizes of electronic devices, ion beams with lower energies are desirable in order to achieve shallow dopant profiles and shallow p-n junctions. Meanwhile, it is also desirable to maintain a relatively high beam current in order to achieve a reasonable production throughput. Such low-energy, high-current ion beams may be difficult to transport within typical ion implanters due to limitations arising from space charge. To prevent "blow-up" of a positive ion beam, negatively charged particles, such as electrons or negative ions, may be introduced for space charge neutralization. One way of sustaining space charge neutralization is through magnetic confinement of negatively charged particles. However, existing magnetic confinement approaches tend to introduce extra magnetic field components that cause ion beam distortion.

For example, FIG. 2 illustrates a conventional method for confining electrons with permanent magnets 202. The permanent magnets 202 may be arranged into two banks, one above and the other below a beam path associated with an ion beam 20. Taking advantage of electrons' tendency to cling to and spiral around magnetic field lines, the permanent magnets 202 can confine electrons (or other charged particles) in cusp magnetic fields in or near the beam path. Generally, the magnet field strength produced by the permanent magnets 202 should be weak enough not to affect transport of the ion beam 20. Note, however, the permanent magnets 202 in existing magnetic confinement approaches are typically arranged for "polar symmetry," wherein like poles face each other across the beam path. That is, the north pole of a magnet in one bank faces the north pole of a corresponding magnet in the other bank. The same is true with south poles. The polar-symmetric arrangement of the permanent magnets 202 may produce a non-zero magnetic field component ($B_z$) in the mid-plane between the two banks of permanent magnets 202. The non-zero magnetic field component $B_z$ can cause any part of the ion beam 20 that is not traveling strictly along the Z-direction to be deflected in the vertical ($\pm Y$) directions, resulting in vertical asymmetries in the ion beam 20. Such vertical asymmetries are typically difficult to correct with other beamline components.

In view of the foregoing, it would be desirable to provide a technique for confining electrons in an ion implanter which overcomes the above-described inadequacies and shortcomings.

SUMMARY OF THE DISCLOSURE

Techniques for confining electrons in an ion implanter are disclosed. In one particular exemplary embodiment, the techniques may be realized as an apparatus for confining electrons in an ion implanter. The apparatus may comprise a first array of magnets and a second array of magnets positioned along at least a portion of a beam path, the first array being on a first side of the beam path and the second array being on a second side of the beam path, the first side opposing the second side. At least one magnet in the first array may have a pole facing an opposite pole of a corresponding magnet in the second array.

In accordance with other aspects of this particular exemplary embodiment, the first array of magnets and the second array of magnets may collectively produce cusp magnetic fields to confine electrons in or near the beam path, wherein components of the cusp magnetic fields parallel to a mid-plane between the first array and the second array are substantially smaller than a component of the cusp magnetic fields perpendicular to the mid-plane. Poles of the magnets may be alternated within each of the first array and the second array to cause the component of the cusp magnetic fields perpendicular to the mid-plane to have alternating polarities.

In accordance with further aspects of this particular exemplary embodiment, at least one of the first array or the second array of magnets may be a permanent magnet.

In accordance with additional aspects of this particular exemplary embodiment, the at least one magnet in the first array and the corresponding magnet in the second array may be oriented along the beam path. Alternatively, the at least one magnet in the first array and the corresponding magnet in the second array may be perpendicular to the beam path.

In accordance with another aspect of this particular exemplary embodiment, the at least one magnet in the first array and the corresponding magnet in the second array may be shaped to reduce a magnetic field component that is perpendicular to the beam path and parallel to a mid-plane between the first array and the second array.

In accordance with yet another aspect of this particular exemplary embodiment, at least a portion of the first array of magnets and the second array of magnets may be arranged in a radial pattern to cover a portion of the beam path through a pair of beamline magnets. The pair of beamline magnets may be part of a mass analyzer. Alternatively, the pair of beamline magnets may be part of an ion beam collimator. Furthermore, at least some of the radially arranged magnets may be curved to reduce a radial magnetic field component.

In accordance with still another aspect of this particular exemplary embodiment, the apparatus may further comprise a third array of magnets and a corresponding fourth array of magnets positioned along a third and a fourth sides of the at least one portion of the beam path. The apparatus may also comprise an electron source that supplies electrons in or near the beam path.

In another particular exemplary embodiment, the techniques may be realized as a method for confining electrons in an ion implanter. The method may comprise positioning a first array of magnets and a second array of magnets along at least a portion of a beam path, the first array being on a first side of the beam path and the second array being on a second side of the beam path, the first side opposing the second side. The method may also comprise arranging the magnets such that at least one magnet in the first array has a pole facing an opposite pole of a corresponding magnet in the second array. The first array of magnets and the second array of magnets may collectively produce cusp magnetic fields to confine electrons in or near the beam path, wherein components of the cusp magnetic fields parallel to a mid-plane between the first array and the second array are substantially smaller than a component of the cusp magnetic fields orthogonal to the mid-plane.

In accordance with other aspects of this particular exemplary embodiment, the method may further comprise alternating poles of the magnets within each of the first array and the second array to cause the component of the cusp magnetic fields perpendicular to the mid-plane to have alternating polarities.

In accordance with further aspects of this particular exemplary embodiment, at least one of the first array or the second array of magnets may be a permanent magnet.

In accordance with additional aspects of this particular exemplary embodiment, the at least one magnet in the first array and the corresponding magnet in the second array may be oriented along the beam path. Alternatively, the at least one magnet in the first array and the corresponding magnet in the second array may be perpendicular to the beam path.

In accordance with another aspect of this particular exemplary embodiment, the method may further comprise shaping the at least one magnet in the first array and the corresponding magnet in the second array to reduce a magnetic field component that is perpendicular to the beam path and parallel to the mid-plane.

In accordance with yet another aspect of this particular exemplary embodiment, the method may further comprise arranging at least a portion of the first array of magnets and the second array of magnets in a radial pattern to cover a portion of the beam path through a pair of beamline magnets. The pair of beamline magnets may be part of a mass analyzer or an ion beam collimator. At least some of the radially arranged magnets may be curved to reduce a radial magnetic field component.

In accordance with still another aspect of this particular exemplary embodiment, the method may further comprise positioning a third array of magnets and a corresponding fourth array of magnets along a third and a fourth sides of the at least one portion of the beam path.

In accordance with a further aspect of this particular exemplary embodiment, the method may further comprise supplying electrons in or near the beam path.

In yet another particular exemplary embodiment, the techniques may be realized as an apparatus for confining electrons in an ion implanter. The apparatus may comprise a first array of magnets and a second array of magnets that are positioned along at least a portion of a beam path, the first array being on a first side of the beam path and the second array being on a second side of the beam path, the first side opposing the second side, wherein the first array of magnets and the second array of magnets collectively produce cusp magnetic fields to confine electrons in or near the beam path. Each magnet in the first array and the second array may be individually shaped to reduce a magnetic field component that is perpendicular to the beam path and parallel to a mid-plane between the first array and the second array.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting present disclosure, but are intended to be exemplary only.

DETAILED DESCRIPTION OF EXEMPLARY EMBODIMENTS

Embodiments of the present disclosure overcome inadequacies and shortcomings in existing magnetic confinement methods used in ion implanters by providing improved techniques for confining electrons or other charged particles in an ion implanter. Instead of the polar-symmetric arrangements of magnets favored in previous approaches, an axi-symmetric arrangement of magnets may be used to confine electrons without excessive distortion of an ion beam. The confinement magnets may be further oriented and shaped to reduce or eliminate unwanted magnetic field components that distort the ion beam.

It should be noted that, although the description hereinafter refers to electrons as the subject of magnetic confinement, embodiments of the present disclosure are not limited to electrons but may be adapted to confine other charged particles including negative and positive ions. Hereinafter, a magnet, whether a permanent magnet or otherwise, is sometimes referred to as a "confinement magnet" if it is used for magnetic confinement purpose.

Figure 1:
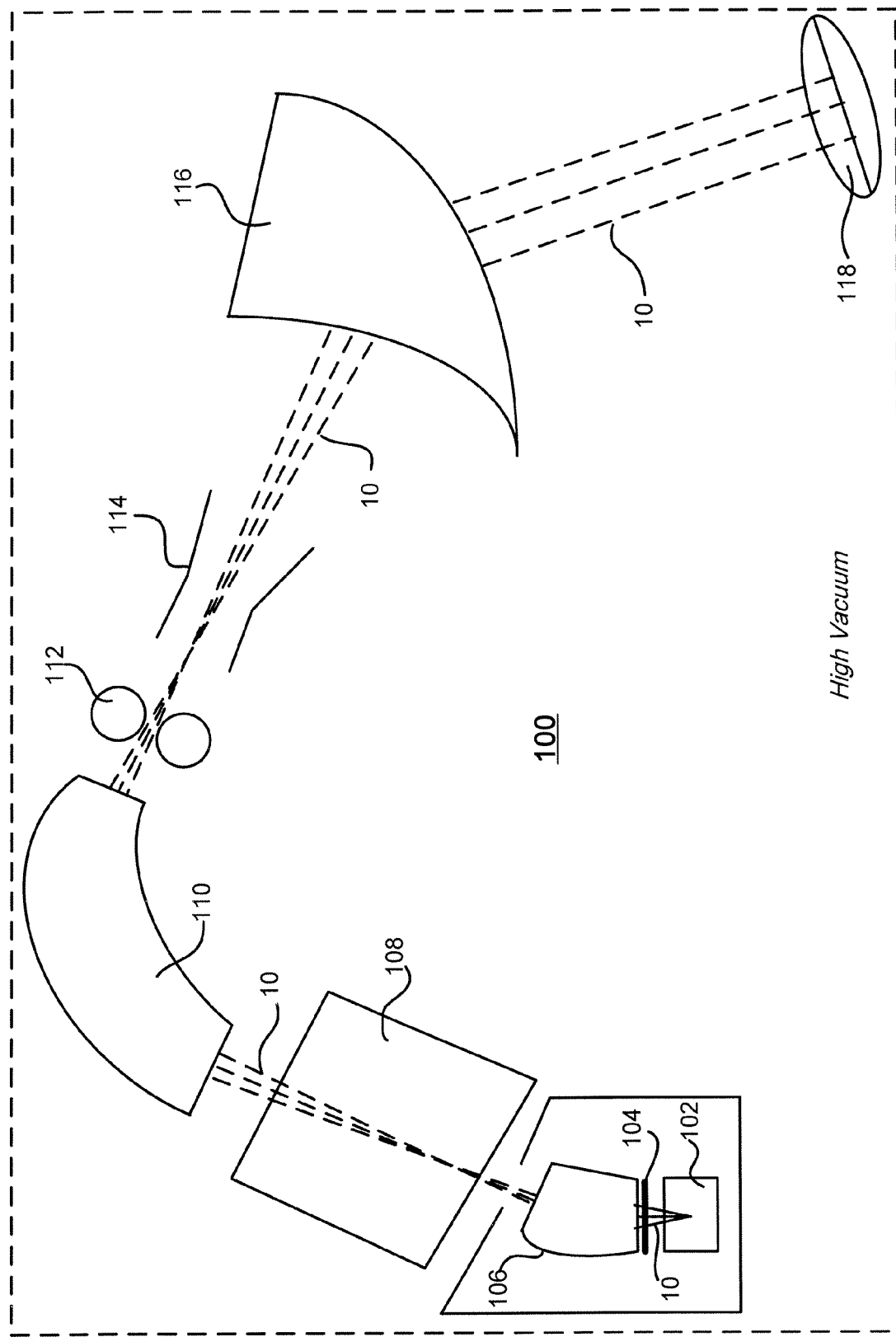
FIG. 1 shows a conventional ion implanter system.
Figure 2:
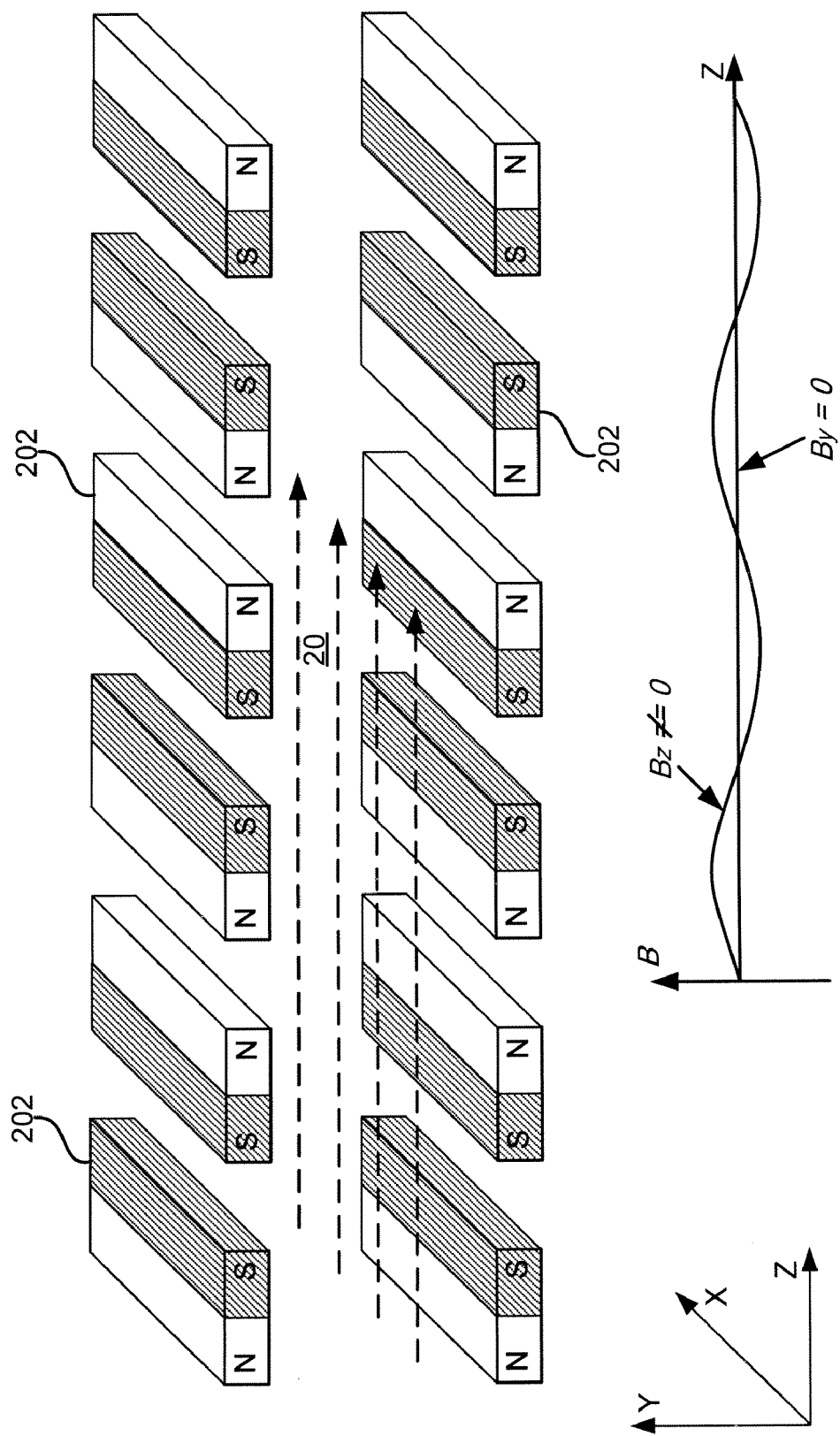
FIG. 2 illustrates a conventional method for confining electrons with a polar-symmetric arrangement of permanent magnets.
Figure 3:
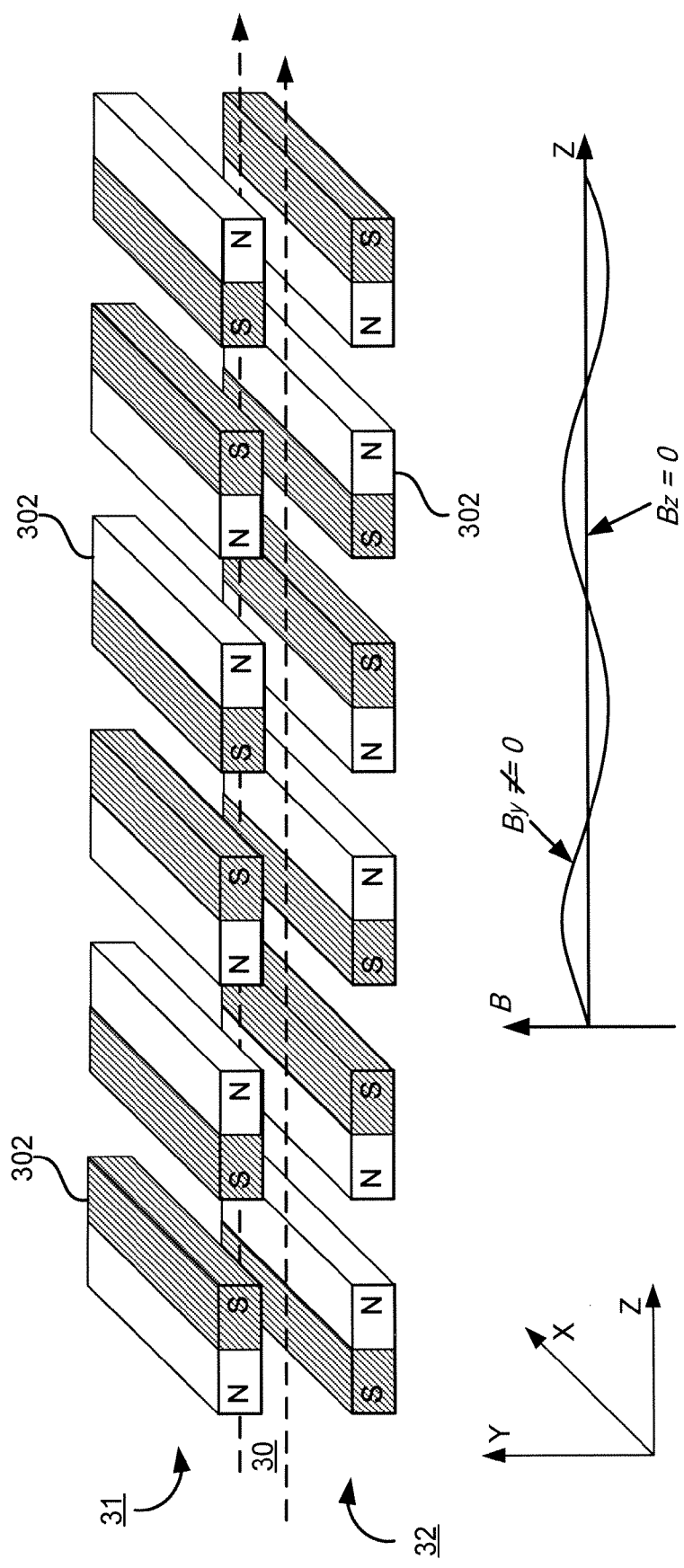
FIG. 3 shows an exemplary arrangement of magnets for confining electrons in accordance with an embodiment of the present disclosure.

Referring to FIG. 3, there is shown an exemplary arrangement of magnets for confining electrons in accordance with an embodiment of the present disclosure. The magnets 302 may be arranged into two arrays, with one array 31 above a beam path of an ion beam 30 and the other array 32 below the beam path. According to some embodiments, the two arrays may be substantially in parallel with one another. The magnets 302 may be permanent magnets with their magnetic orientation aligned approximately with the propagation direction of the ion beam 30. Within each array, polarities of the magnets 302 may be alternated such that cusp magnetic fields may be created in the space between the two arrays (i.e., in or near the beam path of the ion beam 30). According to some embodiments, current-carrying metal coils may also be used in place of the permanent magnets 302 to produce cusp magnetic fields as needed.

One significant difference from existing methods of multi-cusp magnetic confinement lies in the symmetry between the two arrays 31 and 32. Instead of the polar symmetry adopted in existing methods, it is found that axi-symmetry about a mid-plane between the two arrays (31 and 32) may be more beneficial in preserving vertical symmetry of the ion beam 30. That is, instead of having like poles face like poles across the beam path, the two arrays of magnets 302 may be arranged such that opposite poles face each other across the beam path. For example, the north pole of one magnet 302 in the array 31 may face the south pole of a corresponding magnet 302 in the array 32. As a result of this axi-symmetric arrangement, components of the magnetic field, $B_z$ and $B_x$, are zero (or negligibly small) anywhere in the mid-plane. Therefore, there may be little or no vertical deflections of the ion beam 30. On the other hand, the vertical magnetic component $B_y$ may be non-zero at different Z positions in or near the beam path. However, as shown in FIG. 3, the oscillating (±) values of $B_y$ may cause the collective effect of horizontal ion deflections (in X-Z plane) to be relatively small. Even if the vertical magnetic component $B_y$ does cause the ion beam 30 to diverge or distort significantly in the horizontal directions, such horizontal asymmetries may be more easily corrected than vertical asymmetries, for example, with electrostatic or electromagnetic lenses.

Figure 4:
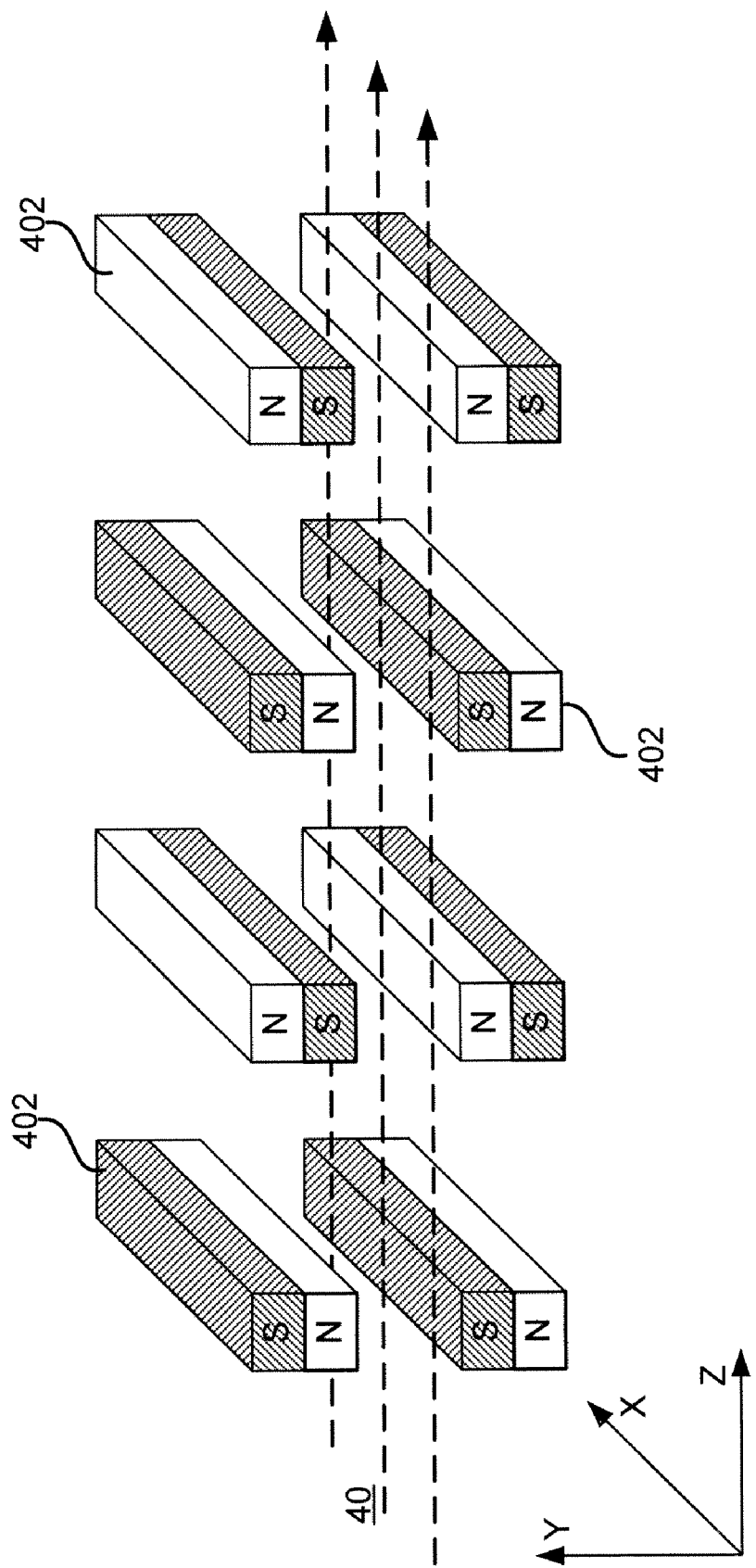
FIG. 4 shows another exemplary arrangement of magnets for confining electrons in accordance with an embodiment of the present disclosure.

FIG. 4 shows another exemplary arrangement of magnets for confining electrons in accordance with an embodiment of the present disclosure. In this embodiment, the magnets 402 may again be arranged into two arrays along a beam path associated with an ion beam 40. The difference from what is shown in FIG. 3 is that each magnet 402 may be oriented vertically instead of horizontally, i.e., with its center line connection north and south poles perpendicular to the beam path. Within each array, the polarities of the magnets 402 may be alternated to produce cusp magnetic fields. Note that the arrangement of the magnets 402 is still axi-symmetric, with opposite poles opposing each other across the beam path. Accordingly, the horizontal magnetic field components may be negligibly small in a mid-plane between the two arrays, causing little or no vertical deflections of the ion beam 40.

The above-described axi-symmetric arrangement of magnets may be applied to any portion of a beam path within an ion implanter. According to some embodiments, such axi-symmetric arrangement of magnets may be beneficially implemented with existing beamline components such as corrector magnets and/or analyzer magnets.

Figure 5:
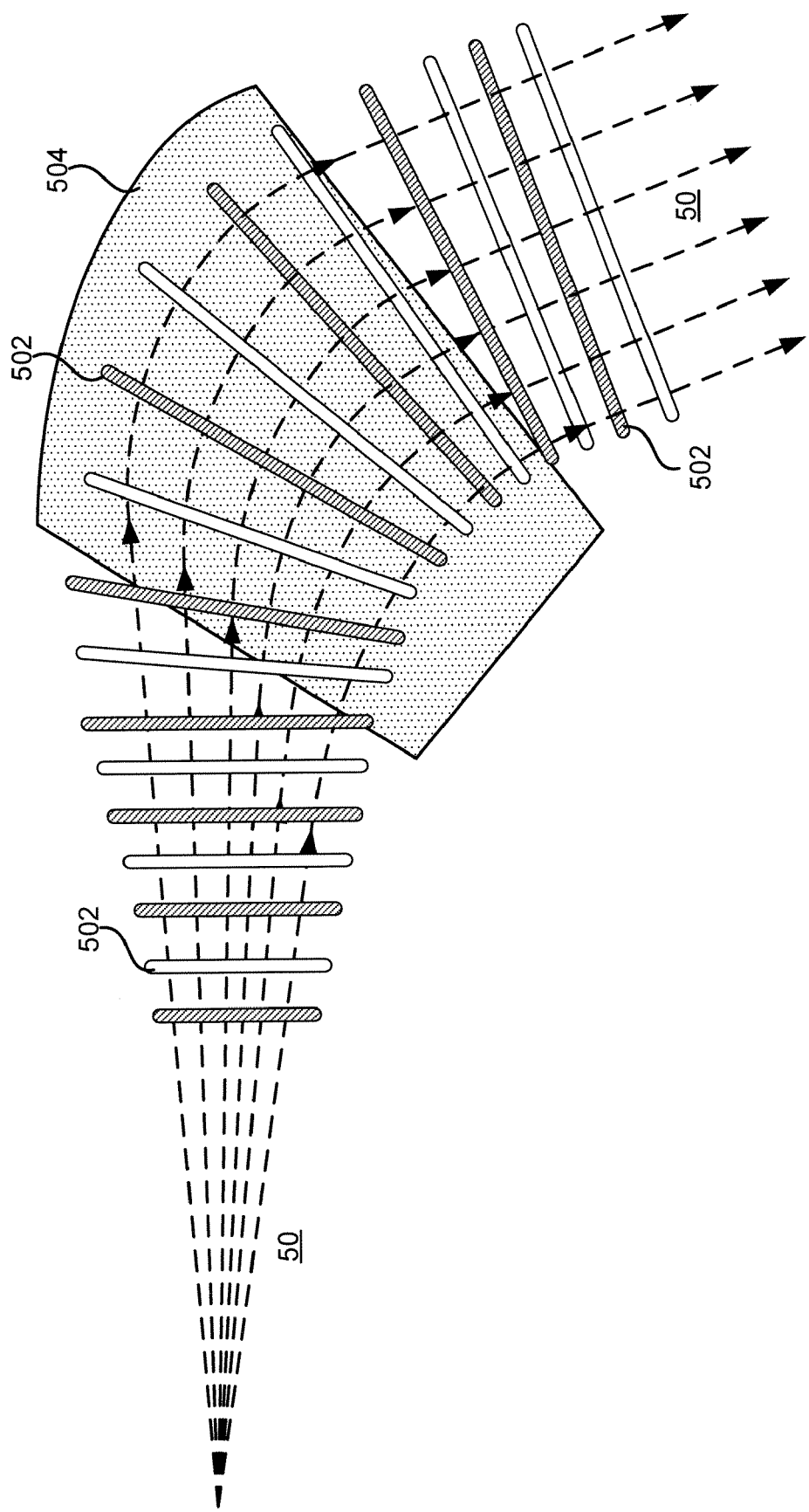
FIG. 5 illustrates an exemplary method for confining electrons with radial cusps in accordance with an embodiment of the present disclosure.

FIG. 5 illustrates an exemplary method for confining electrons with radial cusps in accordance with an embodiment of the present disclosure. In this embodiment, a plurality of confinement magnets 502 may be deployed along a beam path that passes through a point-to-parallel corrector. The confinement magnets 502 may be arranged into two arrays along the beam path with axi-symmetry with respect to a mid-plane between the two arrays, similar to what has been described above. For illustration purposes, only one array of confinement magnets 502 and one corrector magnet 504 are shown in FIG. 5. The corrector magnet 504 may transform an ion beam 50 from a divergent one traveling in a first direction into a parallel one traveling in a second direction. To cover the trajectory of the ion beam 50, the confinement magnets 502 may be placed along the beam path and oriented radially as the ion beam 50 turns the corner.

As described above, the axi-symmetrical arrangement of magnets may help reduce vertical asymmetries in an ion beam. If the ion beam is a ribbon beam and travels along a straight beam path, the confinement magnets may be straight strips and in parallel with one another. As already shown in FIG. 5, to accommodate a curved ion beam trajectory through a pair of corrector magnets, the confinement magnets in each array may no longer be in parallel with one another but may be oriented in a radial pattern. Further analysis of the impact of magnetic field components on beam shape may show benefits of minimizing the radial component of the magnetic field (i.e., making $B_r$ close to zero or negligibly small). To minimize the radial component of the magnetic field, the confinement magnets may be individually shaped such that the center line of each magnet runs normal to ion trajectories at that magnet's position. In other words, depending on ion trajectories, at least some confinement magnets may be curved or, if assembled from many smaller magnets, be laid out in a curved pattern.

Figure 6:
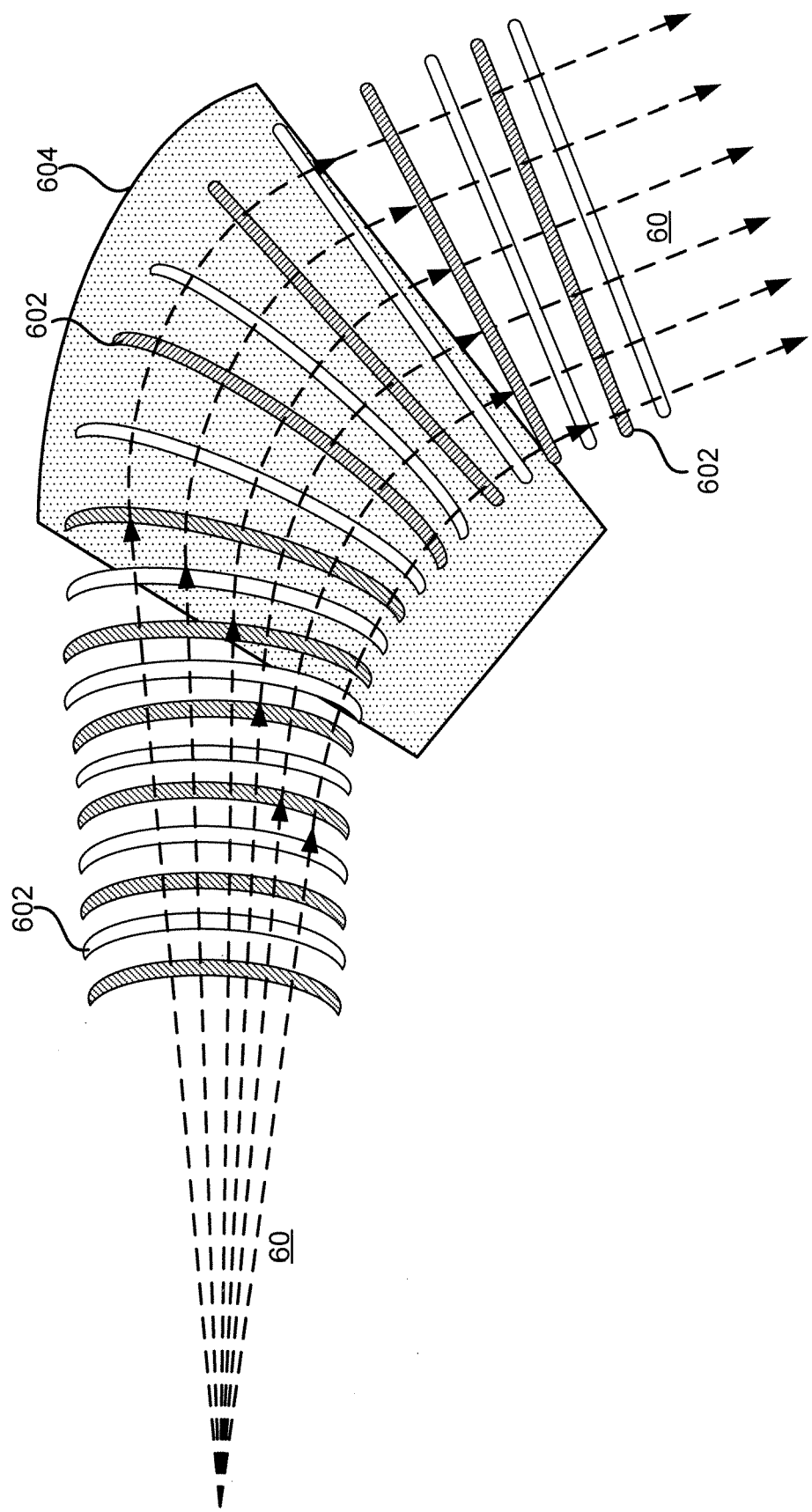
FIG. 6 illustrates an exemplary method for confining electrons with curved cusps in accordance with an embodiment of the present disclosure.

FIG. 6 illustrates an exemplary method for confining electrons with curved cusps in accordance with an embodiment of the present disclosure. Similar to FIG. 5, only one array of confinement magnets 602 and one corrector magnet 604 are shown. To ensure that the trajectory of each beamlet in an ion beam 60 is normal to each magnet 602 that it passes, many of the confinement magnets 602 are curved to varying extents. For example, following ion trajectories, the confinement magnets 602 may be initially curved and positioned in a concentric pattern. As the ion beam 60 makes its way through the corrector, the outside portion of the ion beam 60 may bend more than the inside portion, requiring the confinement magnets 602 to be more curved on one side (outside) than the other side (inside). As the ion beam 60 becomes parallel after passing through the corrector, the corresponding magnets 602 may become less and less curved.

Figure 7:
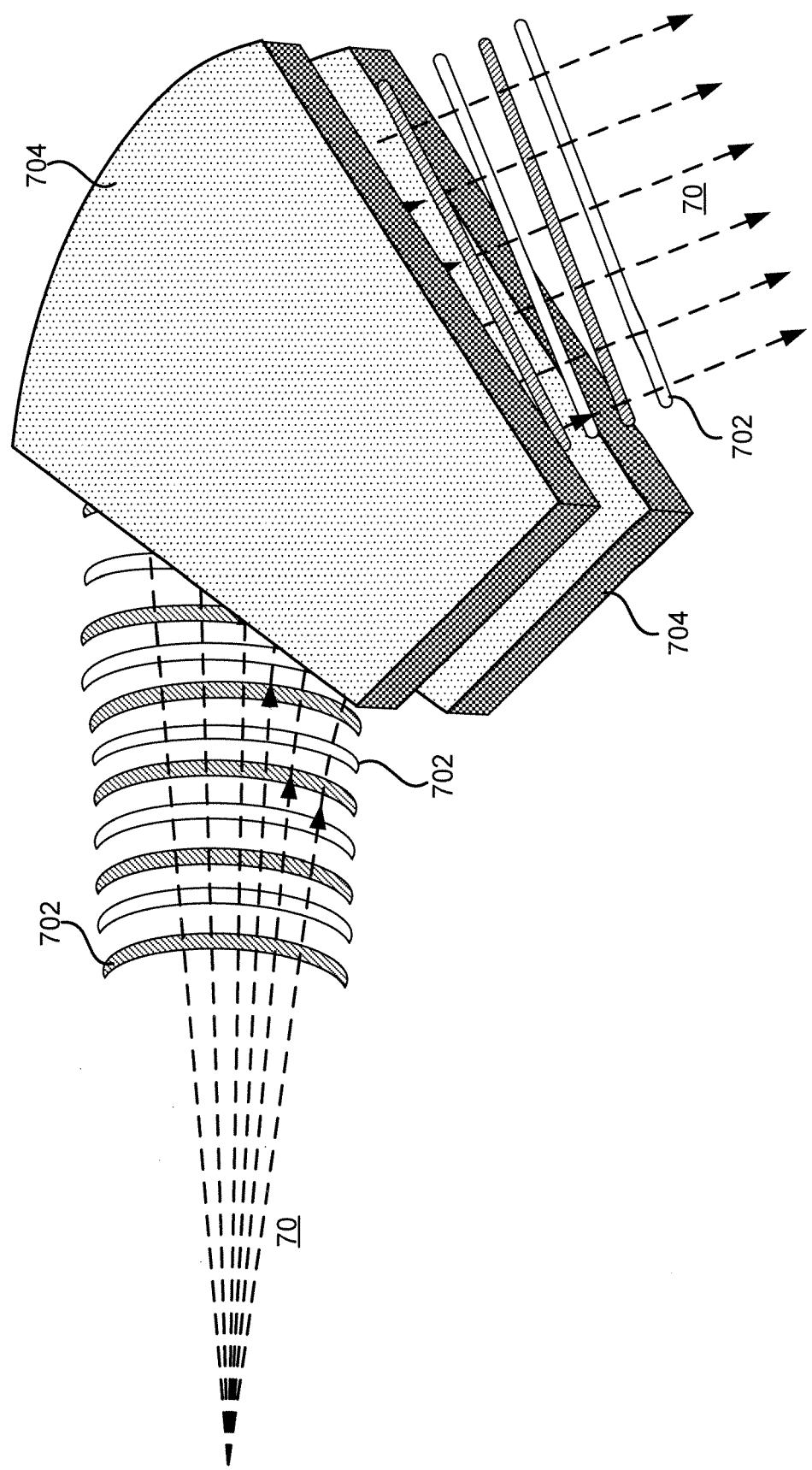
FIG. 7 shows a perspective view of a set of beamline magnets with an arrangement of curved cusps in accordance with an embodiment of the present disclosure.

FIG. 7 shows a perspective view of a set of beamline magnets with an arrangement of curved cusps in accordance with an embodiment of the present disclosure. A set of beamline magnets 704 may be either a pair of corrector magnets or a pair of analyzer magnets. For clarity, only one array of confinement magnets 702 are shown in FIG. 7. As shown, the confinement magnets may be positioned along a beam path of an ion beam 70 that passes between the beamline magnets 704. Each confinement magnet 702 may have a particular curvature that is chosen according to ion trajectories at various points along that confinement magnet 702. Following the beam path, the array of magnets 702 may extend well beyond the beamline magnets 704. In addition, electrons or plasmas may be injected into the ion beam 70 through at least one of the beamline magnets 704 or at other locations along the beam path.

Although the description above only refers to two arrays of confinement magnets being used (i.e., one array above a beam path and the other array below the beam path), embodiments of the present disclosure are not limited to the use of only two arrays of confinement magnets. For example, in addition to the two arrays of confinement magnets as illustrated in FIG. 3, two additional arrays of confinement magnets may be positioned along either side of the beam path. These two additional arrays of confinement magnets may be arranged for polar symmetry or axi-symmetry. The scope of the present disclosure is also not limited to vertically opposed poles of confinement magnets. That is, instead of positioning two arrays of confinement magnets above and below a beam path, these two arrays may be positioned along either side of the beam path, or otherwise disposed about the beam path.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for confining electrons in an ion implanter, the apparatus comprising:
    a first array of magnets and a second array of magnets positioned along at least a portion of a beam path, the first array being on a first side of the beam path and the second array being on a second side of the beam path, the first side opposing the second side;
    wherein at least one magnet in the first array has a pole facing an opposite pole of a corresponding magnet in the second array, and wherein at least a portion of the first array of magnets and the second array of magnets are arranged in a radial pattern to cover a portion of the beam path through a beamline magnet, and at least some of the radially arranged magnets are curved relative to a trajectory of the ion beam to reduce a radial magnetic field component.

2. The apparatus according to claim 1, wherein the first array of magnets and the second array of magnets collectively produce cusp magnetic fields to confine electrons in or near the beam path, and wherein components of the cusp magnetic fields parallel to a mid-plane between the first array and the second array are substantially smaller than a component of the cusp magnetic fields perpendicular to the mid-plane.

3. The apparatus according to claim 2, wherein poles of the magnets are alternated within each of the first array and the second array to cause the component of the cusp magnetic fields perpendicular to the mid-plane to have alternating polarities.

4. The apparatus according to claim 1, wherein at least one of the first array and the second array of magnets is a permanent magnet.

5. The apparatus according to claim 1, wherein the at least one magnet in the first array and the corresponding magnet in the second array are aligned with the beam path.

6. The apparatus according to claim 1, wherein the at least one magnet in the first array and the corresponding magnet in the second array are perpendicular to the beam path.

7. The apparatus according to claim 1, wherein the at least one magnet in the first array and the corresponding magnet in the second array are shaped to reduce a magnetic field component that is perpendicular to the beam path and parallel to a mid-plane between the first array and the second array.

8. The apparatus according to claim 1, wherein the beamline magnet is part of a mass analyzer.

9. The apparatus according to claim 1, wherein the beamline magnet is part of an ion beam collimator.

10. A method for confining electrons in an ion implanter, the method comprising the steps of:
    positioning a first array of magnets and a second array of magnets along at least a portion of a beam path, the first array being on a first side of the beam path and the second array being on a second side of the beam path, the first side opposing the second side;
    arranging the magnets such that at least one magnet in the first array has a pole facing an opposite pole of a corresponding magnet in the second array; and
    wherein the first array of magnets and the second array of magnets collectively produce cusp magnetic fields to confine electrons in or near the beam path, and wherein components of the cusp magnetic fields parallel to a mid-plane between the first array and the second array are substantially smaller than a component of the cusp magnetic fields orthogonal to the mid-plane, and wherein at least a portion of the first array of magnets and the second array of magnets are arranged in a radial pattern to cover a portion of the beam path through a beamline magnet, and at least some of the radially arranged magnets are curved relative to a trajectory of the ion beam to reduce a radial magnetic field component.

11. The method according to claim 10, further comprising:
    alternating poles of the magnets within each of the first array and the second array to cause the component of the cusp magnetic fields perpendicular to the mid-plane to have alternating polarities.

12. The method according to claim 10, wherein at least one of the first array and the second array of magnets is a permanent magnet.

13. The method according to claim 10, wherein the at least one magnet in the first array and the corresponding magnet in the second array are aligned with the beam path.

14. The method according to claim 10, wherein the at least one magnet in the first array and the corresponding magnet in the second array are perpendicular to the beam path.

15. The method according to claim 10, further comprising:
    shaping the at least one magnet in the first array and the corresponding magnet in the second array to reduce a magnetic field component that is perpendicular to the beam path and parallel to the mid-plane.

16. The method according to claim 10, wherein the beamline magnet is part of a mass analyzer.

17. The method according to claim 10, wherein the beamline magnet is part of an ion beam collimator.

18. The method according to claim 10, further comprising:
    supplying electrons in or near the beam path.

19. An apparatus for confining electrons in an ion implanter, the apparatus comprising:
    a first array of magnets and a second array of magnets that are positioned along at least a portion of a beam path, the first array being on a first side of the beam path and the second array being on a second side of the beam path, the first side opposing the second side, wherein the first array of magnets and the second array of magnets collectively produce cusp magnetic fields to confine electrons in or near the beam path;

wherein each magnet in the first array and the second array is individually shaped to reduce a magnetic field component that is perpendicular to the beam path and parallel to a mid-plane between the first array and the second array, and wherein at least a portion of the first array of magnets and the second array of magnets are arranged in a radial pattern to cover a portion of the beam path through a beamline magnet, and at least some of the radially arranged magnets are curved relative to a trajectory of the ion beam to reduce a radial magnetic field component.

* * * * *

UNITED STATES PATENT AND TRADEMARK OFFICE
CERTIFICATE OF CORRECTION

PATENT NO.       : 7,655,922 B2                                        Page 1 of 1
APPLICATION NO.  : 11/568000
DATED            : February 2, 2010
INVENTOR(S)      : Smatlak et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 330 days.

Signed and Sealed this

Thirtieth Day of November, 2010

David J. Kappos
*Director of the United States Patent and Trademark Office*